United States Patent
Bucsa et al.

(10) Patent No.: US 9,360,507 B2
(45) Date of Patent: Jun. 7, 2016

(54) DISPLACEMENT TAMPER SENSOR AND METHOD

(75) Inventors: Andrei Bucsa, Toronto (CA); Stephen D. W. Fosty, Brampton (CA)

(73) Assignee: Tyco Safety Products Canada Ltd., Concord (CA)

( * ) Notice: Subject to any disclaimer, the term of this patent is extended or adjusted under 35 U.S.C. 154(b) by 285 days.

(21) Appl. No.: 13/463,591

(22) Filed: May 3, 2012

(65) Prior Publication Data

US 2013/0154620 A1    Jun. 20, 2013

Related U.S. Application Data

(60) Provisional application No. 61/577,303, filed on Dec. 19, 2011.

(51) Int. Cl.
| | |
|---|---|
| *G01R 23/02* | (2006.01) |
| *H02J 7/00* | (2006.01) |
| *G01R 19/00* | (2006.01) |
| *G06F 17/00* | (2006.01) |
| *H02H 3/087* | (2006.01) |
| *F16H 59/10* | (2006.01) |
| *G01D 5/245* | (2006.01) |
| *G01B 7/00* | (2006.01) |
| *G01B 7/14* | (2006.01) |
| *H02H 3/06* | (2006.01) |

(52) U.S. Cl.
CPC .............. *G01R 23/02* (2013.01); *G01R 19/00* (2013.01); *G06F 17/00* (2013.01); *H02H 3/087* (2013.01); *H02J 7/0068* (2013.01); *F16H 59/105* (2013.01); *G01B 7/003* (2013.01); *G01B 7/14* (2013.01); *G01D 5/2457* (2013.01); *H02H 3/06* (2013.01)

(58) Field of Classification Search
CPC .... G01D 5/2457; G01D 5/145; F16H 59/105; G01B 7/003; G01B 7/14; G01R 23/02
USPC ....................................... 324/207.11
See application file for complete search history.

(56) References Cited

U.S. PATENT DOCUMENTS

| | | | | |
|---|---|---|---|---|
| 4,411,406 A | * | 10/1983 | Inada .................. | F16K 31/0693 251/129.07 |
| 4,590,421 A | * | 5/1986 | Arnoux ................ | G01R 27/20 324/691 |
| 5,764,055 A | * | 6/1998 | Kawase ................ | G01R 33/02 324/207.13 |
| 2007/0012118 A1 | * | 1/2007 | Frank ................... | G01D 5/145 73/779 |
| 2007/0229064 A1 | * | 10/2007 | Van Steenwyk ....... | G01D 5/202 324/207.26 |
| 2008/0164886 A1 | * | 7/2008 | Feucht ................ | G01D 5/2013 324/654 |
| 2008/0258739 A1 | * | 10/2008 | Niwa ..................... | G01D 3/02 324/654 |
| 2008/0315868 A1 | * | 12/2008 | Niwa ..................... | G01D 3/02 324/207.16 |
| 2011/0120300 A1 | * | 5/2011 | Fletcher .............. | F15B 15/2861 92/5 R |

* cited by examiner

*Primary Examiner* — Jermele M Hollington
*Assistant Examiner* — Christopher McAndrew

(57) ABSTRACT

A displacement sensor for sensing displacement of a first surface relative to a second surface includes a coil mounted on the first surface, and encircling a region in plane; and a conductor extending lengthwise from the second surface through the region. The conductor has a volume that varies along its length. An AC source drives the coil to generate a magnetic field that pierces the region and induces eddy currents in the conductor. Eddy current losses resulting from the eddy currents vary in dependence on the volume of the conductor above and beneath the plane. A sensing circuit is coupled to the AC source to detect changes in eddy current losses, and thereby displacement. Detection of displacement may be used to signal tamper/intrusion. The sensor may further include a visual or audible output to signal such displacement.

12 Claims, 3 Drawing Sheets

DISPLACEMENT TAMPER SENSOR AND METHOD

CROSS REFERENCE TO RELATED APPLICATIONS

The present application claims priority from U.S. Provisional Patent Application No. 61/577,303, filed Dec. 19, 2011 the contents of which are hereby incorporated by reference.

FIELD OF THE INVENTION

The present invention relates generally to intrusion or tamper sensors, and more particularly to sensors suitable for detecting the displacement of one surface relative to another.

BACKGROUND OF THE INVENTION

Often cabinets housing electronic equipment or valuables need to be secured against tamper and theft. One way to provide such security is to use an electronic alarm that that produces a signal in response to sensed tamper or movement.

Existing tamper circuits are typically simplistic—formed, for example using one or more conductors—and easily bypassed, or complex—using for example tilt or vibration sensors—and expensive.

Accordingly, there is need for a displacement sensor that may be used in a tamper detection circuit.

SUMMARY OF THE INVENTION

In an embodiment, a displacement sensor for sensing displacement of a first surface relative to a second surface includes a coil mounted on the first surface, and encircling a region in plane; and a conductor extending lengthwise from the second surface through the region. The conductor has a volume that varies along its length. An AC source drives the coil to generate a magnetic field that pierces the region and induces eddy currents in the conductor. Eddy current losses resulting from the eddy currents vary in dependence on the volume of the conductor above and beneath the plane. A sensing circuit is coupled to the AC source to detect changes in eddy current losses, and thereby displacement. Detection of displacement may be used to signal tamper/intrusion. The sensor may further include a visual or audible output to signal such displacement.

In a further embodiment, a method of sensing displacement of a first surface relative to a second surface, comprises: mounting a coil mounted on the first surface, encircling a region in plane; providing a conductor having a volume that varies along its length, extending from the second surface through the region, the conductor; driving the coil to generate a time varying magnetic field that pierces the region and induces eddy currents in the conductor, and whereby eddy current losses resulting from the eddy currents vary in dependence on the volume of the conductor above and beneath the plane; and detecting changes in eddy current losses resulting from the driving to detect displacement.

Other aspects and features of the present invention will become apparent to those of ordinary skill in the art upon review of the following description of specific embodiments of the invention, in conjunction with the accompanying figures.

BRIEF DESCRIPTION OF THE DRAWINGS

In the figures which illustrate by way of example only, embodiments of the present invention.

DETAILED DESCRIPTION

Figure 1:
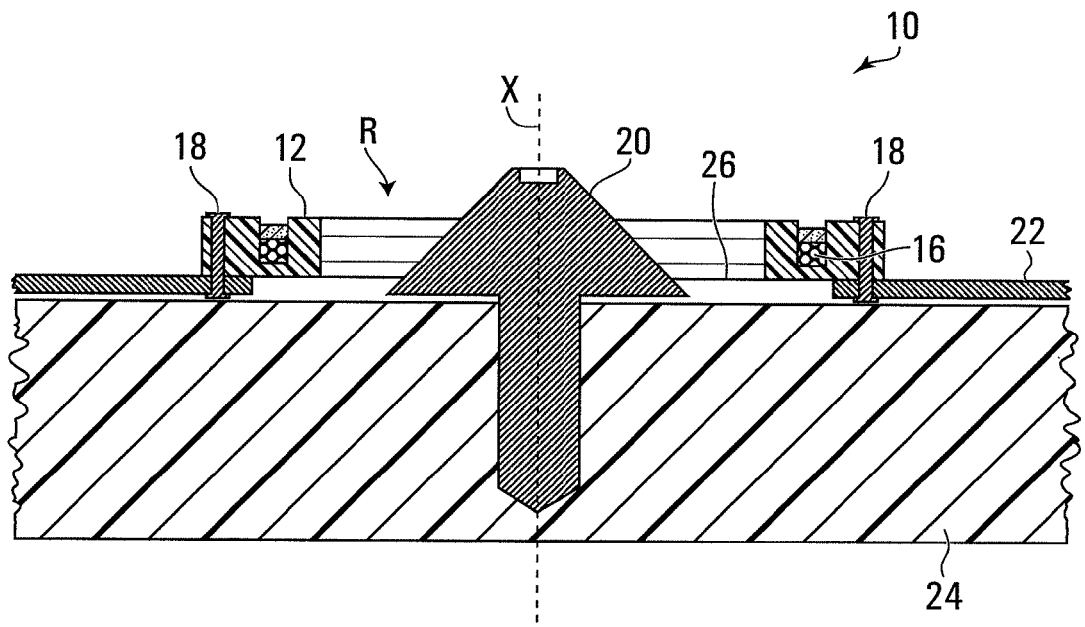
FIG. 1 is a side plan view of a displacement/tamper sensor, as installed, exemplary of an embodiment of the present invention.
Figure 2:
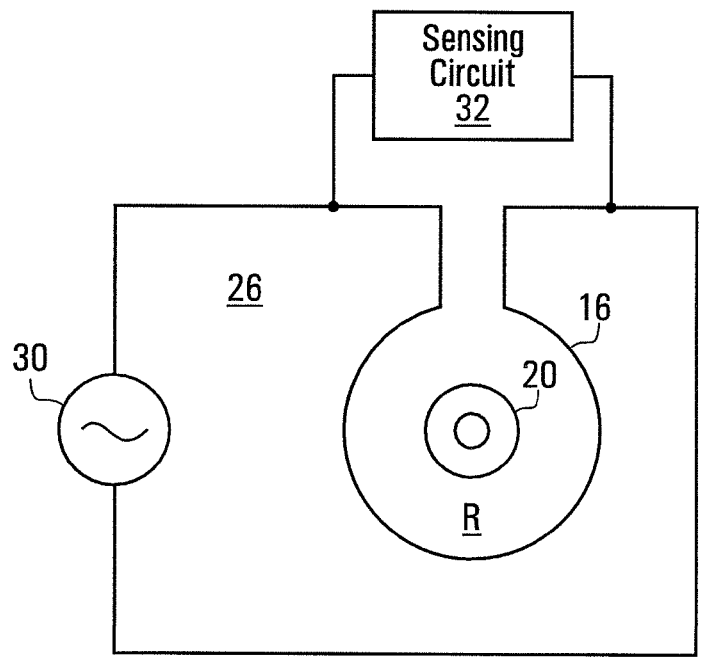
FIG. 2 is a simplified schematic diagram of the displacement sensor of FIG. 1.

FIG. 1 is a side cross-sectional view of a tamper/displacement sensor 10, as installed, exemplary of an embodiment of the present invention. A corresponding schematic diagram of displacement sensor 10 is depicted in FIG. 2.

As illustrated in FIG. 1, sensor 10 includes a coil 16 that surrounds or encircles a region R in plane 26. In the depicted embodiment region R is generally circular. However, region R could be polygonal (e.g. rectangular), oval, or even irregular in shape. Coil 16 is substantially flat and formed by a generally circular multi-turn wire loop.

Figure 3:
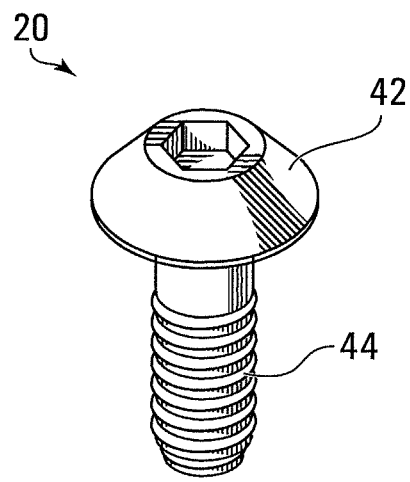
FIG. 3 is a perspective view of a conductor of the displacement sensor of FIG. 1.

A lengthwise extending conductor 20 pierces plane 26 in region R. Conductor 20 is formed of a conductive material such as iron, an iron alloy, aluminium, steel, or the like. Conductor 20 has a varying volume along its lengthwise axis X. Lengthwise axis X pierces plane 26 and is normal thereto. As further illustrated in FIG. 3, conductor 20 may be a conventional machine screw having a frustro-conical head 42, extending form a threaded shaft 44. Head 42 may have a socket hole for receiving a fastening key or driver, such as a screw driver or Allan key.

Conductor 20 is mounted on a first surface 24, while coil 16 is mounted on a second surface 22. For example, first surface 24 may be a structural wall or the floor, while second surface 22 may be the surface of a cabinet. As will become apparent, sensor 10 may be used to sense motion or displacement of surface 22 relative to surface 24, particularly in the direction along the length of conductor 20 (e.g. along axis X). Sensor 10 may be therefore be used to monitor tampering with the cabinet.

AC source 30 (FIG. 2) drives coil 16 to generate a magnetic field that pierces plane 26 and induces an eddy current in conductor 20. Further, a sensing circuit 32 may be interconnected with coil 16 to provide an indicator of the eddy current losses. As will become apparent, a change in eddy current losses signifies displacement of coil 16 relative to conductor 20, and thus motion. Sensing circuit 32, in turn, may signal motion/tampering. The signal may be audible, visual, or to another circuit or device.

Figure 4:
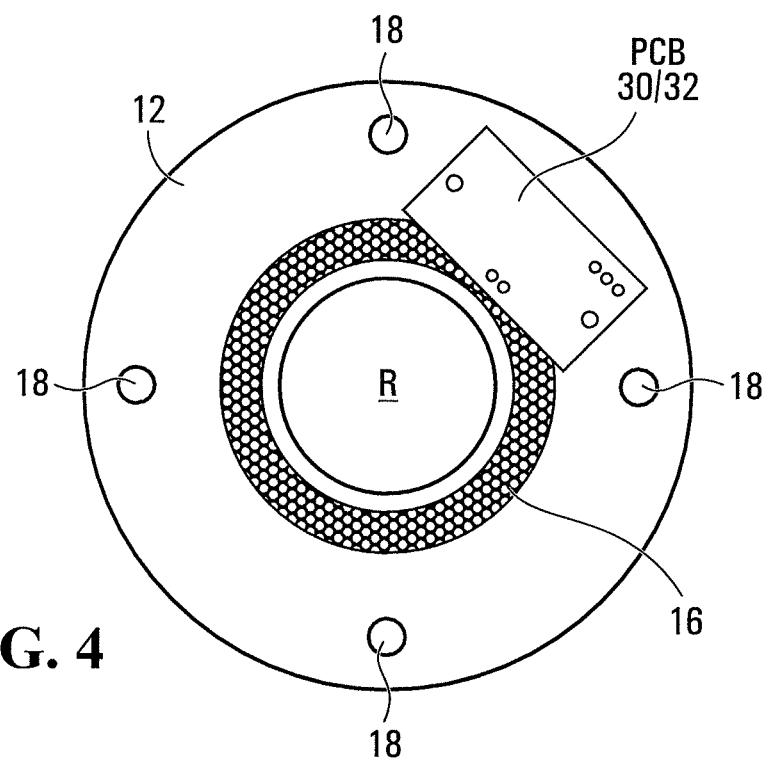
FIG. 4 is a top plan view of a gasket used in the displacement sensor of FIG. 1.

A gasket 12 carries coil 16, and may electrically isolate displacement sensor 10 from surface 24, as best illustrated in FIGS. 1 and 4. Gasket 12 may be sufficiently large to accommodate AC source 30 and sensing circuit 32. Gasket 12 may electrically insulate coil 16 from the cabinet to which sensor 10 is ultimately mounted—e.g. the cabinet depicted in FIG. 1. Gasket 12 may be mounted to the cabinet by way of fasteners 18, which may be rivets, screws or the like. Gasket 12 may be formed of plastic, silicone, rubber, or other insulating material such as Textolite, Teflon, paper, or wood, among others. Of course, AC source 30 and sensing circuit 32 could be mounted elsewhere, and need not be carried by gasket 12.

Coil 16 is driven by alternating current (AC) source 30, which in turn generates an alternating magnetic field interior to the loop defined by coil 16. The field lines of the magnetic field pierce plane 26. The magnetic field, in turn induces eddy currents in any conductive material in its path. These eddy currents result in eddy current losses. In particular, eddy current losses may be calculated as $$P = \frac{\pi^2 B_p^2 f^2}{k\rho D} d^2 = m \cdot d^2 \quad (1)$$

Where P=power dissipation (W/Kg); $B_p$=peak flux density (T); d=diameter of the conductor 20; k depends on the geometry of conductor 20; f is the frequency of the AC source; and p is the resistivity of conductor 20 and D is the specific density of conductor 20, and m represents an equivalent constant.

Equation (1) generally holds true for quasi-static conditions, where the magnetization of the material forming conductor 20 does not result in skin effects.

Now, as the volume of conductor 20 above plane 26 varies, d will vary, and m remains generally constant. Conveniently, this variation in volume may be used to detect displacement of coil 16 relative to conductor 20, particularly in the direction of X. As should be apparent, the variation in the displacement of coil 16 relative to the head 42 of conductor 20 will modulate eddy current power losses as the diameter and geometry exposed to coil 16 are changing.

Frustro-conical head 42 ensures that the volume of conductor 20 pierced by the magnetic field of coil 16 will vary with any displacement of the position of conductor 20 relative to coil 16, in the direction of axis X. This, in turn, ensures that eddy current losses vary with the displacement of the position of conductor 20 relative to coil 16. That is, eddy current losses resulting from these eddy currents vary in dependence on the volume of conductor 20 above and beneath plane 26. Other geometries of conductor 20 may similarly cause a variation of eddy current losses with the displacement of the position of conductor 20 relative to coil 16.

As will be appreciated, the shape of head 42 of conductor 20 may be varied as long as it is irregular. A frustro-conical head 42 is conveniently easy to manufacture.

Figure 5:
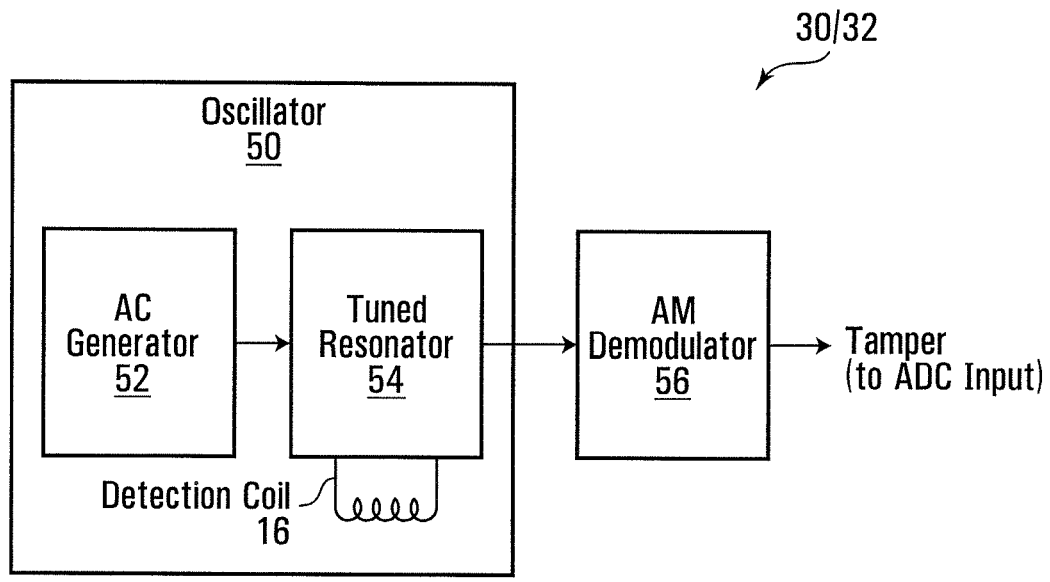
FIG. 5 is a block diagram of an example AC source/sensing circuit of the displacement sensor of FIG. 1.
Figure 6:
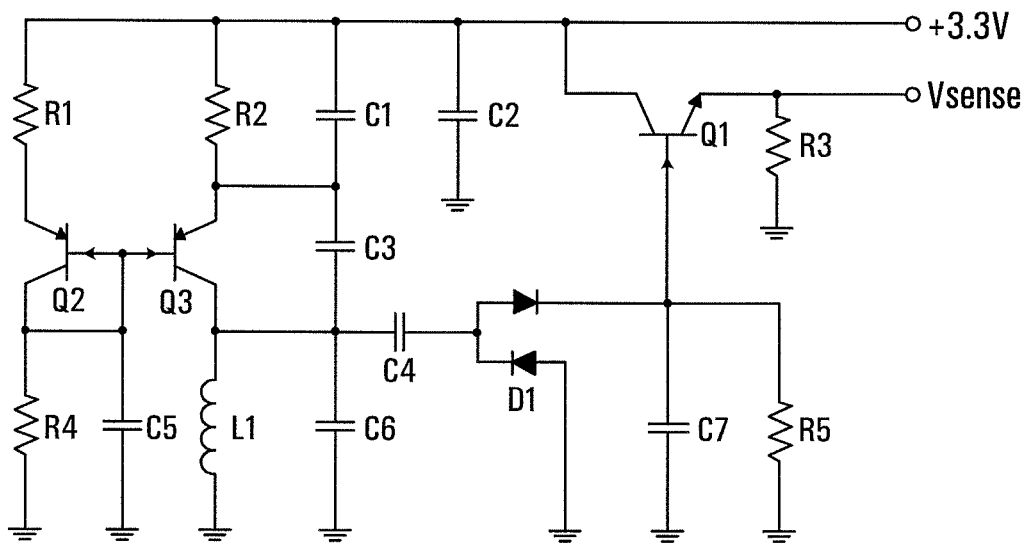
FIG. 6 is a schematic diagram of an example AC source/sensing circuit of the displacement sensor of FIG. 1.

AC source 30 and sensing circuit 32 may be formed as illustrated in FIGS. 5 and 6. As illustrated, source 30/circuit 32 may include an oscillator 50, formed of an AC generator 52 connected to a tuned resonator 54. Tuned resonator 54 may be tuned by coil 16. An amplitude demodulator (AM demodulator) 56 may detect the envelope of the AC signal coupled to tuned resonator 54. The amplitude of oscillation of resonator 54 will vary with eddy current losses.

Oscillator 50 may be formed as a Colpitts oscillator formed of Q3, C1, C3, C6, R2, L1 and Q2, C5, R1=R2, C5 and R4 provide biasing and temperature compensation, with values chosen to provide an oscillation frequency of about 800 kHz, as illustrated in FIG. 6. C4, D1, C7 and R5 form an AC rectifier/AM demodulator 56 and Q1 is an impedance adapter forming part of AM demodulator 56. L1 represents the inductance of coil 16 in the presence of head 42 of conductor 20. Of course, oscillator 50 may easily be adapted to oscillate at other suitable frequencies—for example between about 1 kHz and 1 MHz.

As will be appreciated, the amplitude of oscillation of tuned resonator 54 is very high if coil 16/L1 is free of conductive objects and decreases proportionally to eddy current losses—if the volume inside coil 16 increases. Sensing circuit 32 may also include an analog to digital converter (ADC); an audible or visible output; or an electric output to another circuit.

Example component values may be R1=4.7 kΩ; R2=4.7 kΩ; R3=10 kΩ; R4=3.6 kΩ; R5=220 kΩ; C1=2.2 nF; C2=1 μF; C3=180 pF, C4=47 pF; C5=10 nF; C6=180 pF; C7=2.2 nF; D1=BAB99; Q1=MMBT4401; Q2, Q3=MMBT4403.

With the given component values, the amplitude on the output of demodulator 56 is about 750 mV, in the absence of any head 42 in region R, and in the presence of head 42 in region R having about ½ the diameter of coil 16, reduces to about 8 mV. These values may easily be sensed using a conventional analog to digital converter (not shown).

AC source 30 and sensing circuit 32 may be operated continuously and consumes about 0.75 mA of current at 3.3 V and an oscillation frequency of 800 kHZ. For example, an alarm condition may be triggered if the output of filter rises above 100 mV and remains there for a chosen duration (e.g. 200 ms).

As will be appreciated, AC source 30 and the accompanying sensing circuit 32 could be formed in numerous other ways—using for example other types of oscillators; digital signal processors; or a variety of other discrete or integrated components appreciated by those of ordinary skill.

Conveniently, if surface 24 and coil 20 move in tandem in direction X, the resulting change in eddy current losses will be minimal, and may thus not trigger an alarm.

As will be appreciated, although sensor 10 has been described as a tamper sensor, it could easily be used in other applications that require the sensing of displacement. For example, sensor 10 could be used as a seismic sensor.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A displacement sensor for sensing displacement of a first surface relative to a second surface, said displacement sensor comprising
    a substantially flat coil mounted on said first surface, and encircling a region in a plane;
    a conductor extending lengthwise from said second surface through said region, said conductor having a volume above and beneath said substantially flat coil, and a cross-section that is non-uniform normal to said conductor's lengthwise extent;
    wherein said substantially flat coil forms part of a oscillator, and wherein said oscillator comprises:
      a tuned resonator;
      an AC supply to drive said tuned resonator to a resonant frequency dictated by said substantially flat coil, and to drive said substantially flat coil to generate a magnetic field that pierces said region and induces eddy currents in said conductor, and whereby eddy current losses resulting from said eddy currents vary in dependence on the relative volume of said conductor above and beneath said substantially flat coil; and
    a sensing circuit coupled to said oscillator to detect changes in power consumption of said AC supply resulting from said eddy current losses by detecting changes in amplitude of oscillation of said oscillator, and thereby displacement of said relative volume of said conductor above and beneath said substantially flat coil.

2. The displacement sensor of claim 1, wherein said conductor comprises a frustro-conical portion.

3. The displacement sensor of claim 1, wherein said conductor comprises a bolt having frustro-conical head.

4. The displacement sensor of claim 1, wherein said resonant frequency is between about 1 kHz and 1 MHz.

5. The displacement sensor of claim 1, further comprising a gasket, and wherein said substantially flat coil is mounted to said gasket.

6. The displacement sensor of claim 5, wherein said gasket is formed of at least one of rubber, silicone, plastic, Textolite, Teflon, paper, or other insulating material.

7. The displacement sensor of claim 6, wherein said oscillator and said sensing circuit are mounted to said gasket.

8. The displacement sensor of claim 5, wherein said gasket is mounted to a cabinet.

9. The displacement sensor of claim 1, wherein said sensing circuit further comprises an audible or visible output for signaling displacement.

10. A method of sensing displacement of a first surface relative to a second surface, said method comprising mounting a substantially flat coil on said first surface, encircling a region in a plane, said substantially flat coil forming part of an oscillator, wherein said oscillator comprises a tuned resonator;

providing a conductor having a volume above and beneath said substantially flat coil, and a cross-section that is non-uniform normal to said conductor's lengthwise extent, extending lengthwise from said second surface through said region;

driving said tuned resonator by an AC supply to a resonant frequency dictated by said substantially flat coil to drive said substantially flat coil to generate a time varying magnetic field that pierces said region and induces eddy currents in said conductor, and whereby eddy current losses resulting from said eddy currents vary in dependence on the relative volume of said conductor above and beneath said substantially flat coil; and detecting changes in power consumption of said AC supply resulting from said eddy current losses by detecting changes in amplitude of oscillation of said oscillator to detect displacement of said relative volume of said conductor above and beneath said substantially flat coil.

11. The method of claim 10, further comprising signaling a tamper condition in response to sensing displacement of said first surface relative to said second surface.

12. The displacement sensor of claim 1, wherein said oscillator is formed as a Colpitts oscillator.

\* \* \* \* \*